United States Patent
Kuo et al.

(10) Patent No.: US 8,985,834 B2
(45) Date of Patent: Mar. 24, 2015

(54) ASSEMBLY METHOD FOR BACKLIGHT MODULE AND ASSEMBLY EQUIPMENT THEREOF

(75) Inventors: Yi-cheng Kuo, Guangdong (CN); Yu-chun Hsiao, Guangdong (CN); Chengwen Que, Guangdong (CN); Pangling Zhang, Guangdong (CN); Dehua Li, Guangdong (CN)

(73) Assignee: Shenzhen China Star Optoelectronics Technology co., Ltd., Shenzhen, Guangdong (CN)

( * ) Notice: Subject to any disclaimer, the term of this patent is extended or adjusted under 35 U.S.C. 154(b) by 320 days.

(21) Appl. No.: 13/583,000

(22) PCT Filed: Aug. 16, 2012

(86) PCT No.: PCT/CN2012/080206
§ 371 (c)(1),
(2), (4) Date: Sep. 6, 2012

(87) PCT Pub. No.: WO2014/026347
PCT Pub. Date: Feb. 20, 2014

(65) Prior Publication Data
US 2014/0049989 A1    Feb. 20, 2014

(51) Int. Cl.
*F21V 7/04* (2006.01)
*G09F 13/04* (2006.01)
*H05K 13/00* (2006.01)
*G02F 1/13* (2006.01)
*G02F 1/1335* (2006.01)
*G02F 1/1333* (2006.01)

(52) U.S. Cl.
CPC ............... *G09F 13/04* (2013.01); *H05K 13/00* (2013.01); *G02F 1/1303* (2013.01); *G02F 1/1336* (2013.01); *G02F 2001/133325* (2013.01)

USPC ....... 362/634; 362/633; 362/249.01; 362/600

(58) Field of Classification Search
CPC .... G02B 6/0053; G02B 6/009; G02B 6/0088; G02B 6/0086; G02B 6/0065; G02B 6/0091; G02F 1/133615; G02F 1/133608; G02F 1/133605; G02F 1/133308
USPC .......... 362/633, 249.01, 97.1, 362, 97.2, 600, 362/632, 615, 634; 349/65, 60, 58
See application file for complete search history.

(56) References Cited

U.S. PATENT DOCUMENTS

| | | | | |
|---|---|---|---|---|
| 2004/0246401 | A1* | 12/2004 | Lee et al. | 349/58 |
| 2004/0263716 | A1* | 12/2004 | Lee et al. | 349/61 |
| 2008/0084696 | A1* | 4/2008 | Yang et al. | 362/249 |
| 2008/0143918 | A1* | 6/2008 | Kim | 349/58 |
| 2008/0186431 | A1* | 8/2008 | Imojo et al. | 349/65 |

(Continued)

*Primary Examiner* — Thomas A Hollweg
*Assistant Examiner* — Kevin Quarterman
(74) *Attorney, Agent, or Firm* — Andrew C. Cheng

(57) ABSTRACT

The present invention discloses an assembly method for backlight module and assembly equipment thereof. The method includes: stacking reflector, light-guiding plate and optical film to form a component entirety and fixing the component entirety; fixing at least two main connection elements in head-to-tail manner to form a back plate on four sides around the component entirety so as to fix reflector, light-guiding plate and optical film to corresponding position on the back plate respectively. The method is suitable for realization with automatic equipment. Through automatic equipment to assemble backlight module, the assembly efficiency can be improved to reduce the labor required for backlight module assembly and reduce labor cost.

12 Claims, 5 Drawing Sheets

(56) References Cited

U.S. PATENT DOCUMENTS

| | | | |
|---|---|---|---|
| 2009/0290089 A1* | 11/2009 | Ichioka et al. | 349/58 |
| 2010/0277664 A1* | 11/2010 | Kim et al. | 349/58 |
| 2011/0090426 A1* | 4/2011 | Choi et al. | 349/65 |
| 2012/0327633 A1* | 12/2012 | Jang | 362/97.1 |

* cited by examiner

ASSEMBLY METHOD FOR BACKLIGHT MODULE AND ASSEMBLY EQUIPMENT THEREOF

BACKGROUND OF THE INVENTION

1. Field of the Invention

The present invention relates to the field of displaying techniques, and in particular to an assembly method for backlight module and assembly equipment thereof.

2. The Related Arts

A liquid crystal display module comprises back plate, light-guiding plate, reflector, optical film, plastic frame, display panel and front frame. In known techniques, the assembling of liquid crystal display module is often executed manually: laying the back plate flat, fixing reflector to the back plate, fixing light-guiding plate and optical film to the back plate in order. At this point, the backlight module of the liquid crystal display module is assembled. The backlight module is then put to plastic frame, and the display panel is placed in top of the plastic frame and the front frame is placed to cover. The front frame and the plastic frame are fixed together. As such, the manual assembling of the above liquid crystal display module usually takes more time and more man power.

In addition, there are different sizes of display panels for different needs. For example, in the TV market, the sizes of display panels include 31.5, 42, 46, 48 and 55 inches. Different sizes of display panel require different sizes of back plate, and the large-size back plate usually occupies more volume.

SUMMARY OF THE INVENTION

The technical issue to be addressed by the present invention is to provide an assembly method for backlight module and assembly equipment thereof, to improve assembly efficiency of backlight module, reduce labor cost and reduce product cost.

The present invention provides an assembly method for backlight module, which comprises: using positioning mechanism to position in the order of reflector, light-guiding plate and optical film on a platform; clamping by top and bottom to fix reflector, light-guiding plate and optical film to form a component entirety and removing the platform and the positioning mechanism, space being reserved around the component entirety for four main connection elements to be connected in head-to-tail manner and fixed to form a back plate after removing the platform and the positioning mechanism, wherein the four main connection elements having a shape of long strip; fixing the four main connection elements on four sides around the component entirety respectively so as to fix reflector, light-guiding plate and optical film to corresponding position on the back plate respectively.

According to a preferred embodiment of the present invention, the main connection elements are fixed by using engagement, screw, soldering or adhesive.

According to a preferred embodiment of the present invention, the main connection element comprises at least two connection sub-elements, the at least two connection sub-elements are connected and fixed to form the main connection element.

According to a preferred embodiment of the present invention, the connection sub-elements are fixed by using engagement, screw, soldering or adhesive.

The present invention provides an assembly method for backlight module, which comprises: stacking reflector, light-guiding plate and optical film to form a component entirety and fixing the component entirety; fixing at least two main connection elements in head-to-tail manner to form a back plate on four sides around the component entirety so as to fix reflector, light-guiding plate and optical film to corresponding position on the back plate respectively.

According to a preferred embodiment of the present invention, the step of fixing the component entirety comprises: using positioning mechanism to position in the order of reflector, light-guiding plate and optical film on a platform; clamping by top and bottom to fix reflector, light-guiding plate and optical film to form a component entirety and removing the platform and the positioning mechanism, space being reserved around the component entirety for four main connection elements to be connected in head-to-tail manner and fixed to form a back plate after removing the platform and the positioning mechanism.

According to a preferred embodiment of the present invention, the main connection elements are fixed by using engagement, screw, soldering or adhesive.

According to a preferred embodiment of the present invention, the main connection element comprises at least two connection sub-elements, the at least two connection sub-elements are connected and fixed to form the main connection element.

According to a preferred embodiment of the present invention, the main connection elements comprise a first main connection element, a second main connection element, a third main connection element and a fourth main connection element, the first main connection element, second main connection element, third main connection element and fourth main connection element all have a long strip shape and are connected and fixed in head-to-tail manner to form a surrounding back plate.

The present invention provides an assembly equipment for backlight module, which comprises: a fixing device and an assembly device, the fixing device being for stacking reflector, light-guiding plate and optical film to form a component entirety and fixing the component entirety; the assembly device being for fixing at least two main connection elements in head-to-tail manner to form a back plate on four sides around the component entirety so as to fix reflector, light-guiding plate and optical film to corresponding position on the back plate respectively.

According to a preferred embodiment of the present invention, the fixing device comprises a platform and a clamping unit, the platform is hollow at the center area and disposed with positioning mechanism on the peripheral, the clamping unit comprises an upper clamping unit and a lower clamping unit, the lower clamping unit is located in the hollow space of the platform.

According to a preferred embodiment of the present invention, the main connection elements are fixed by using engagement, screw, soldering or adhesive.

According to a preferred embodiment of the present invention, the main connection element comprises at least two connection sub-elements, the at least two connection sub-elements are connected and fixed to form the main connection element.

According to a preferred embodiment of the present invention, the main connection elements comprise a first main connection element, a second main connection element, a third main connection element and a fourth main connection element, the first main connection element, second main connection element, third main connection element and fourth main connection element all have a long strip shape and are connected and fixed in head-to-tail manner to form a surrounding back plate.

The efficacy of the present invention is that to be distinguished from the state of the art. The present invention first stacks reflector, light-guiding plate and optical film to form a component entirety and fixes the component entirety: and then fixes at least two main connection elements in head-to-tail manner to form a back plate on four sides around the component entirety so as to fix reflector, light-guiding plate and optical film to corresponding position on the back plate respectively. The aforementioned stacking reflector, light-guiding plate and optical film to form a component entirety and fixing the component entirety, and then fixing at least two main connection elements in head-to-tail manner to form a back plate on four sides around the component entirety are suitable for realization with automatic equipment. Through automatic equipment to assemble backlight module, the assembly efficiency can be improved to reduce the labor required for backlight module assembly and reduce labor cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following refers to drawings and embodiments for detailed description.

Figure 1:
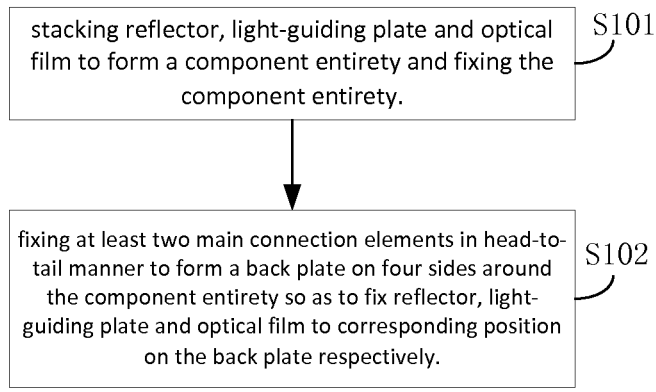
FIG. 1 is a schematic view showing the flowchart of an embodiment of the assembly method for backlight module according to the present invention.
Figure 2:
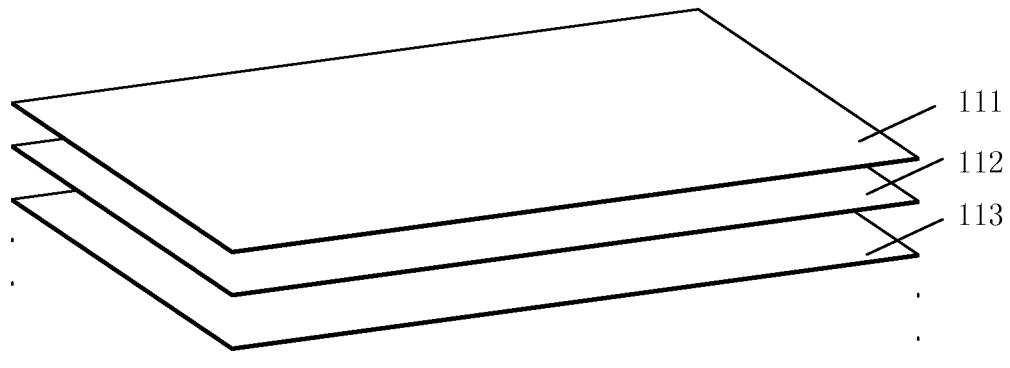
FIG. 2 is a schematic view showing the stacking of reflector, light-guiding plate and optical film to form a component entirety in the assembly method of the backlight module according to the present invention.
Figure 2:
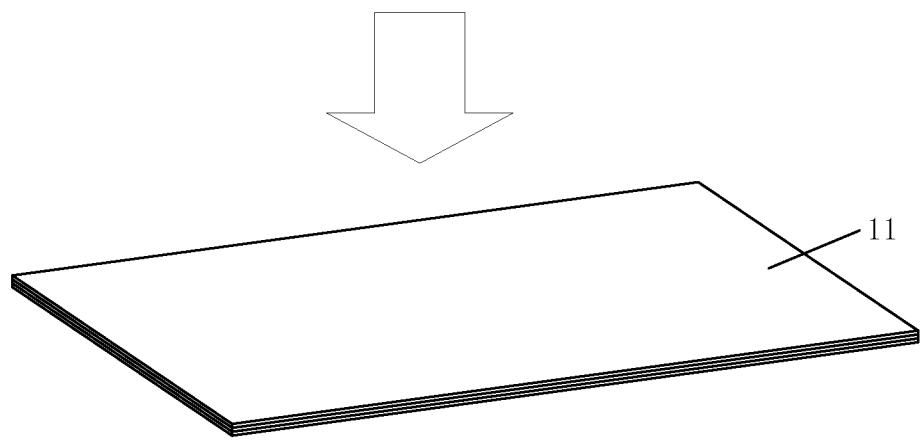
Figure 3:
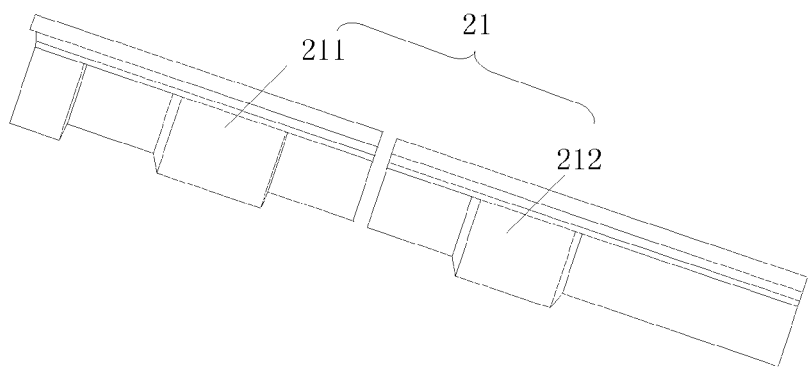
FIG. 3 is a schematic view showing one of the main connection elements of the back disassembled in the assembly method of the backlight module according to the present invention.
Figure 4:
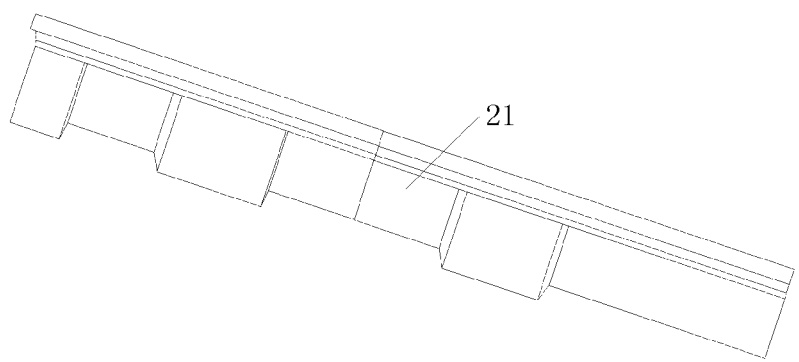
FIG. 4 is a schematic view showing assembling main connection element of FIG. 3.
Figure 5:
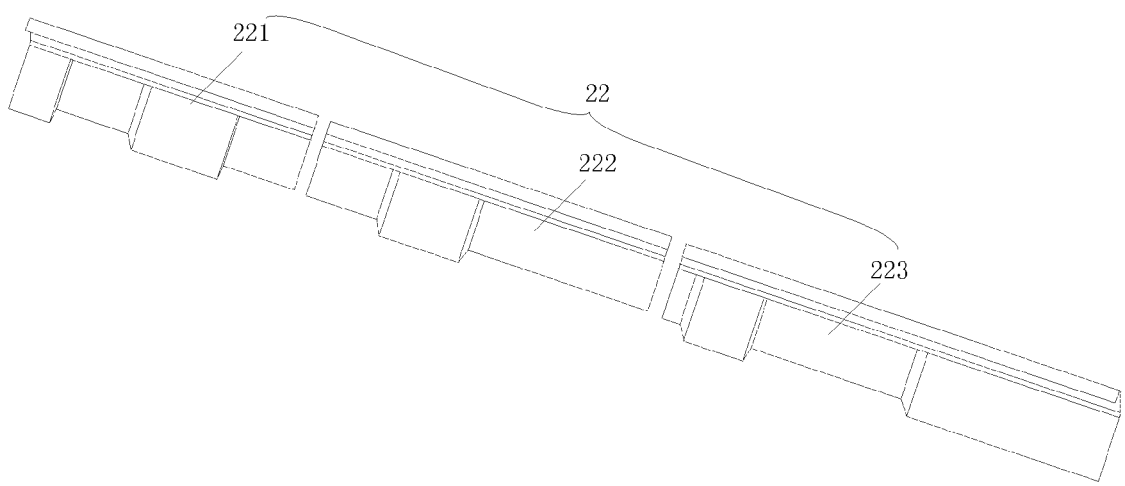
FIG. 5 is a schematic view showing another main connection element of the back disassembled in the assembly method of the backlight module according to the present invention.
Figure 6:
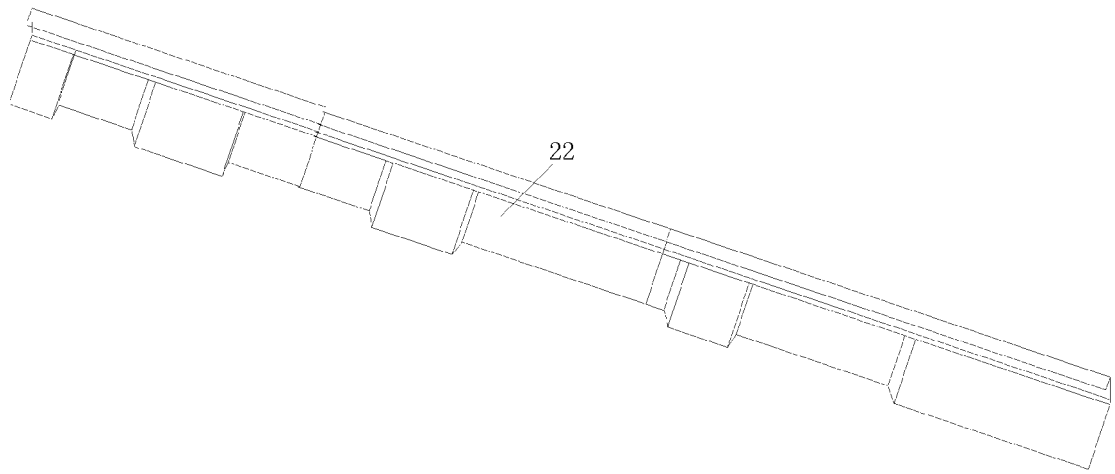
FIG. 6 is a schematic view showing assembling main connection element of FIG. 5.

Referring to FIG. 1 and FIG. 2, FIG. 1 is a schematic view showing the flowchart of an embodiment of the assembly method for backlight module according to the present invention, and FIG. 2 is a schematic view showing the stacking of reflector, light-guiding plate and optical film to form a component entirety in the assembly method of the backlight module according to the present invention. The assembly method comprises the following steps.

S101: stacking reflector 113, light-guiding plate 112 and optical film 111 to form a component entirety 11 and fixing the component entirety 11.

In the instant embodiment, fixing the component entirety 11 is realized through the use of automatic equipment. No specific restriction is placed on the manner in which component entirety 11 is fixed so as not to interfere with assembling back plate. In the instant embodiment, the step of fixing the component entirety comprises: using positioning mechanism to position in the order of reflector, light-guiding plate and optical film on a platform; clamping by top and bottom to fix reflector, light-guiding plate and optical film to form a component entirety and removing the platform and the positioning mechanism, space being reserved around the component entirety for four main connection elements to be connected in head-to-tail manner and fixed to form a back plate after removing the platform and the positioning mechanism to avoid interfering with assembling main connection elements.

S102: fixing at least two main connection elements in head-to-tail manner to form a back plate on four sides around the component entirety so as to fix reflector, light-guiding plate and optical film to corresponding position on the back plate respectively.

A main connection element can further comprise at least two connection sub-elements, the at least two connection sub-elements are connected and fixed to form the main connection element. The connection sub-elements are fixed by using engagement, screw, soldering or adhesive. The main connection element is divided into at least two connection sub-elements, and the designs are optimized so that main connection elements of different sizes can use the same connection sub-elements to achieve mold sharing, mold cost reduction and product cost reduction.

As shown in FIGS. 3-6, main connection element 21 comprises a first connection sub-element 211 and a second connection sub-element 212. First connection sub-element 211 and second connection sub-element 212 are connected and fixed to form main connection element 21. Main connection element 22 comprises a third connection sub-element 221, a fourth connection sub-element 222 and a fifth connection sub-element 223. Third connection sub-element 221, a fourth connection sub-element 222 and a fifth connection sub-element 223 are connected and fixed to form main connection element 22. First connection sub-element 211 is the same as third connection sub-element 221, and second connection sub-element 212 is the same as fourth connection sub-element 222. Therefore, first connection sub-element 211 and third connection sub-element 221 can be manufactured with the same mold, and second connection sub-element 212 and fourth connection sub-element 222 can be manufactured with the same mold. This achieves mold sharing and mold cost reduction.

The minimum number of main connection elements to form a back plate is two. The at least two main connection elements are connected and fixed in a head-to-tail manner to form a surrounding back plate. The main connection elements are fixed by using engagement, screw, soldering or adhesive. The following uses four main connection elements forming the back plate as an exemplar for description.

Figure 7:
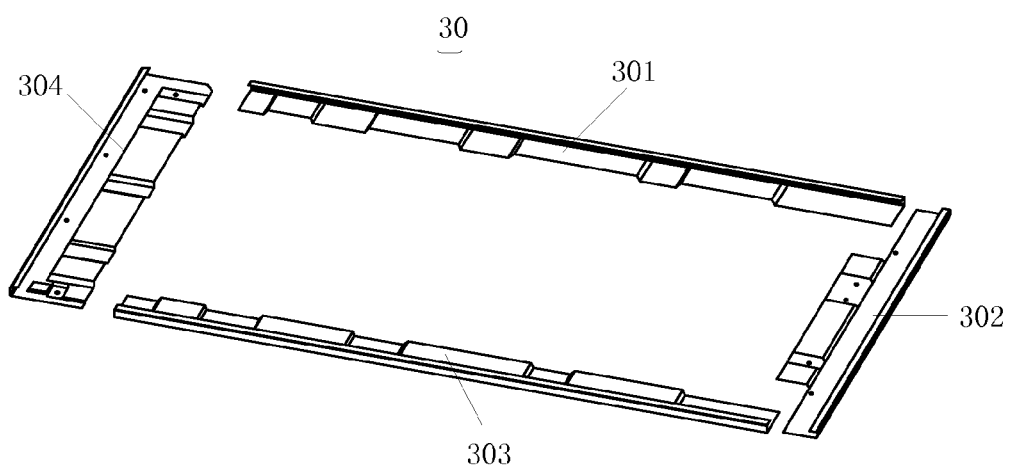
FIG. 7 is a schematic view showing four main connection elements forming the back plate in the assembly method of the backlight module according to the present invention.
Figure 8:
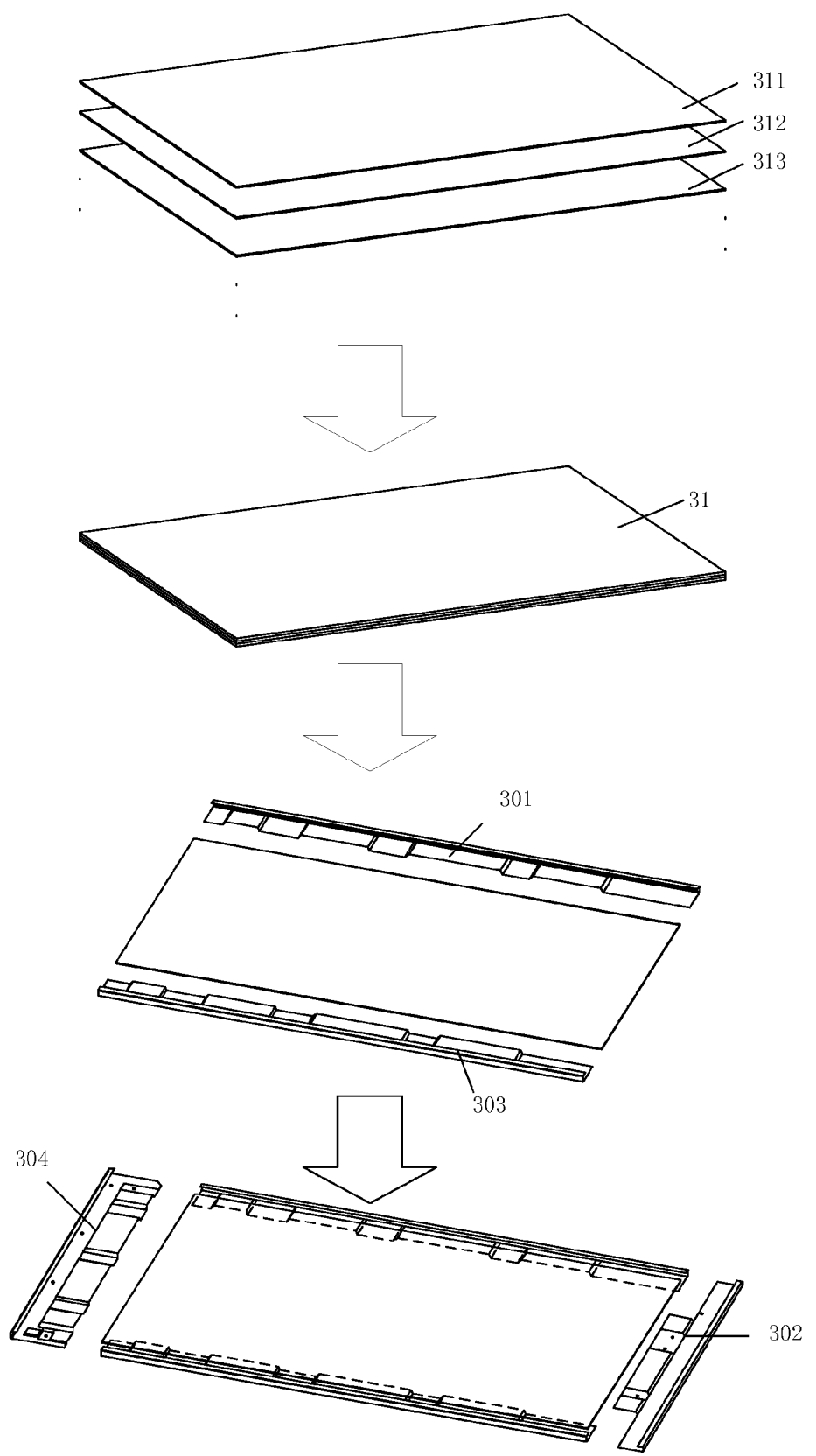
FIG. 8 is a schematic view showing the backlight module with four main connection elements forming the back plate in the assembly method of the backlight module according to the present invention.

Referring to FIG. 7 and FIG. 8, FIG. 7 is a schematic view showing four main connection elements forming the back plate in the assembly method of the backlight module according to the present invention, and FIG. 8 is a schematic view showing the backlight module with four main connection elements forming the back plate in the assembly method of the backlight module according to the present invention. As shown in the FIGS. 7-8, back plate 30 comprises a first main connection element 301, a second main connection element 302, a third main connection element 303 and a fourth main connection element 304. The shape of first main connection element 301, second main connection element 302, third main connection element 303 and fourth main connection element 304 is a long strip. First main connection element 301, second main connection element 302, third main connection element 303 and fourth main connection element 304 are fixed in a head-to-tail manner when assembled to form a surrounding back plate 30. In assembly, reflector 313, light-guiding plate 312 and optical film 311 are stacked to form a component entirety 31. With automatic equipment, first main connection element 301 and third main connection element 303 of back plate 30 are fixed to front side and back side of component entirety 31. Then, second main connection element 302 and fourth main connection element 304 of back plate 30 are fixed to right side and left side of component entirety 31. Obviously, the manner to fix the main connection elements of back plate 30 to the peripheral of component entirety 31 is not restricted to the aforementioned manner, any other equivalent manners can also be used to fix the main connection elements of back plate 30 to the peripheral of component entirety 31 so as to fix reflector 313, light-guiding plate 312 and optical film 311 corresponding location on back plate 30 respectively. For example, a main connection element can be fixed at a time, or three main connection elements are fixed at first and then the last main connection element is fixed.

The present invention first stacks the reflector, light-guiding plate and optical film to form a component entirety and fixes the component entirety; and then fixes at least two main connection elements in head-to-tail manner to form a back plate on four sides around the component entirety so as to fix reflector, light-guiding plate and optical film to corresponding position on the back plate respectively. The above assembly method is suitable for realization with automatic equipment. Through automatic equipment to assemble backlight module, the assembly efficiency can be improved to reduce the labor required for backlight module assembly and reduce labor cost.

Figure 9:
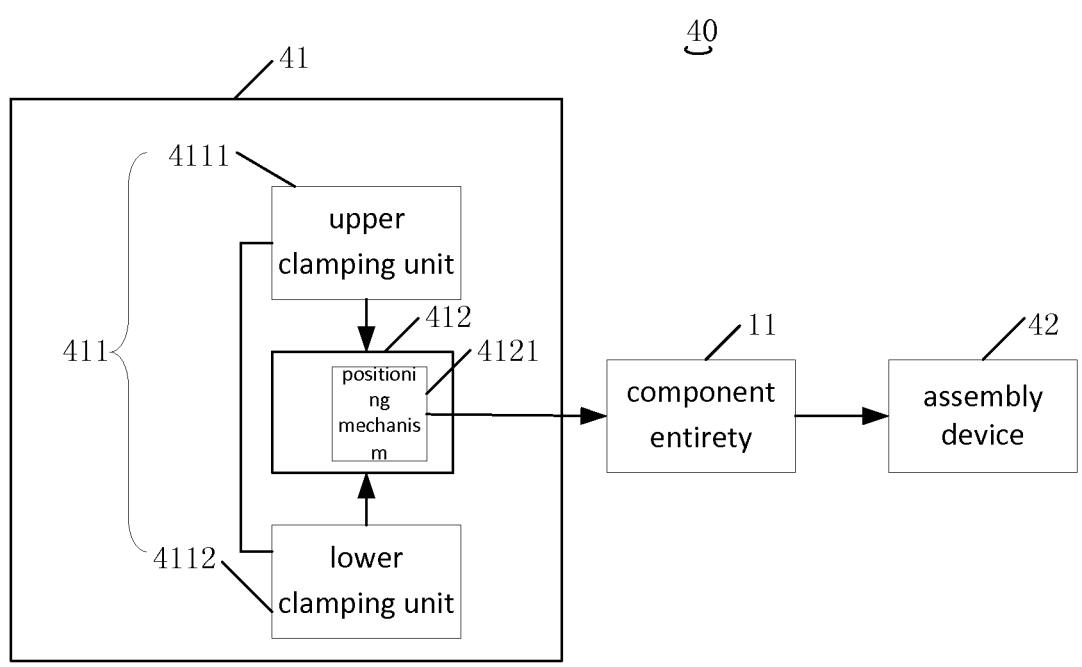
FIG. 9 is a schematic view showing the structure of the assembly equipment for backlight module according to the present invention.

The present invention further provides an embodiment of assembly equipment for backlight module. Referring to FIG. 9 and FIG. 2, FIG. 9 is a schematic view showing the structure of the assembly equipment for backlight module according to the present invention. As shown in FIGS. 2 and 9, assembly equipment 40 comprises: a fixing device 41 and an assembly device 42. The fixing device 41 is for stacking reflector 113, light-guiding plate 112 and optical film 111 to form a component entirety 11 and fixing the component entirety 11. The fixing device 41 comprises a platform 412 and a clamping unit 411. The platform 412 is hollow at the center area and disposed with positioning mechanism 4121 on the peripheral. The clamping unit 411 comprises an upper clamping unit 4111 and a lower clamping unit 4112. The lower clamping unit 4112 is located in the hollow space of the platform 412. The positioning mechanism 4121 positions in the order of reflector 113, light-guiding plate 112 and optical film 11 on platform 412.

The upper clamping unit 4111 and lower clamping unit 4112 clamp from top and bottom on reflector 113, light-guiding plate 112 and optical film 11 to form component entirety 11, and the platform 412 and the positioning mechanism 4121 are removed. Space must be reserved around the component entirety 11 for fixing four main connection elements of back plate after removing the platform 412 and the positioning mechanism 4121.

The assembly device 42 is for fixing at least two main connection elements in head-to-tail manner to form a back plate on four sides around the component entirety 11 so as to fix reflector 113, light-guiding plate 112 and optical film 111 to corresponding position on the back plate respectively.

The number of main connection elements of back plate is at least two. The at least two main connection elements are connected and fixed in head-to-tail manner to form a surrounding back plate; wherein the main connection elements are fixed by using engagement, screw, soldering or adhesive. In the instant embodiment, the number of main connection elements is four. Also refer to FIGS. 7-8. Back plate 30 comprises a first main connection element 301, a second main connection element 302, a third main connection element 303 and a fourth main connection element 304. The shape of first main connection element 301, second main connection element 302, third main connection element 303 and fourth main connection element 304 is a long strip. First main connection element 301, second main connection element 302, third main connection element 303 and fourth main connection element 304 are fixed in a head-to-tail manner when assembled to form a surrounding back plate 30. In assembly, reflector 313, light-guiding plate 312 and optical film 311 are stacked to form a component entirety 31. With automatic equipment, first main connection element 301 and third main connection element 303 of back plate 30 are fixed to front side and back side of component entirety 31. Then, second main connection element 302 and fourth main connection element 304 of back plate 30 are fixed to right side and left side of component entirety 31. As such, reflector 313, light-guiding plate 312 and optical film 311 are fixed to corresponding location on back plate 30 respectively.

In the instant embodiment, a main connection element can further comprise at least two connection sub-elements, the at least two connection sub-elements are connected and fixed to form the main connection element. The main connection element is divided into at least two connection sub-elements, and the designs are optimized so that main connection elements of different sizes can use the same connection sub-elements to achieve mold sharing, mold cost reduction and product cost reduction. Refer to FIGS. 3-4 again, main connection element 21 comprises a first connection sub-element 211 and a second connection sub-element 212. First connection sub-element 211 and second connection sub-element 212 are connected and fixed to form main connection element 21. Main connection element 22 comprises a third connection sub-element 221, a fourth connection sub-element 222 and a fifth connection sub-element 223. Third connection sub-element 221, a fourth connection sub-element 222 and a fifth connection sub-element 223 are connected and fixed to form main connection element 22. First connection sub-element 211 is the same as third connection sub-element 221, and second connection sub-element 212 is the same as fourth connection sub-element 222. Therefore, first connection sub-element 211 and third connection sub-element 221 can be manufactured with the same mold, and second connection sub-element 212 and fourth connection sub-element 222 can be manufactured with the same mold. This achieves mold sharing and mold cost reduction.

The present invention first stacks the reflector, light-guiding plate and optical film to form a component entirety and fixes the component entirety; and then fixes at least two main connection elements in head-to-tail manner to form a back plate on four sides around the component entirety so as to fix reflector, light-guiding plate and optical film to corresponding position on the back plate respectively. The above assembly method is suitable for realization with automatic equipment. Through automatic equipment to assemble backlight module, the assembly efficiency can be improved to reduce the labor required for backlight module assembly and reduce labor cost.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An assembly method for backlight module, which comprises:
    using a positioning mechanism to position in the order of reflector, light-guiding plate and optical film on a platform;
    clamping by top and bottom to fix reflector, light-guiding plate and optical film to form a component entirety and removing the platform and the positioning mechanism, space being reserved around the component entirety for four main connection elements to be connected in head-to-tail manner and fixed to form a back plate after removing the platform and the positioning mechanism, wherein the four main connection elements having a shape of long strip;
    fixing the four main connection elements on four sides around the component entirety respectively so as to fix reflector, light-guiding plate and optical film to corresponding position on the back plate respectively.

2. The assembly method as claimed in claim 1, characterized in that: the main connection elements are fixed by using engagement, screw, soldering or adhesive.

3. The assembly method as claimed in claim 1, characterized in that: the main connection element comprises at least two connection sub-elements, the at least two connection sub-elements are connected and fixed to form the main connection element.

4. The assembly method as claimed in claim 3, characterized in that: the connection sub-elements are fixed by using engagement, screw, soldering or adhesive.

5. An assembly method for backlight module, which comprises:
    stacking reflector, light-guiding plate and optical film to form a component entirety and fixing the component entirety;
    fixing at least two main connection elements in head-to-tail manner to form a back plate on four sides around the component entirety so as to fix reflector, light-guiding plate and optical film to corresponding position on the back plate respectively;
    wherein the step of fixing the component entirety comprises:
    using positioning mechanism to position in the order of reflector, light-guiding plate and optical film on a platform;
    clamping by top and bottom to fix reflector, light-guiding plate and optical film to form a component entirety and removing the platform and the positioning mechanism, space being reserved around the component entirety for four main connection elements to be connected in head-to-tail manner and fixed to form a back plate after removing the platform and the positioning mechanism.

6. The assembly method as claimed in claim 5, characterized in that: the main connection elements are fixed by using engagement, screw, soldering or adhesive.

7. The assembly method as claimed in claim 5, characterized in that: the main connection element comprises at least two connection sub-elements, the at least two connection sub-elements are connected and fixed to form the main connection element.

8. The assembly method as claimed in claim 5, characterized in that:
    the main connection elements comprise a first main connection element, a second main connection element, a third main connection element and a fourth main connection element;
    the first main connection element, second main connection element, third main connection element and fourth main connection element all have a long strip shape and are connected and fixed in head-to-tail manner to form a surrounding back plate.

9. An assembly equipment for backlight module, which comprises:
    a fixing device and an assembly device;
    the fixing device being for stacking reflector, light-guiding plate and optical film to form a component entirety and fixing the component entirety;
    the assembly device being for fixing at least two main connection elements in head-to-tail manner to form a back plate on four sides around the component entirety so as to fix reflector, light-guiding plate and optical film to corresponding position on the back plate respectively;
    wherein the fixing device comprises a platform disposed with positioning mechanism on the peripheral and a clamping unit, the platform is hollow at the center area, the positioning mechanism is for positioning in the order of reflector, light-guiding plate and optical film on the platform, the clamping unit comprises an upper clamping unit and a lower clamping unit which is located in the hollow space of the platform, the upper clamping unit and the lower clamping unit are for clamping by top and bottom to fix reflector, light-guiding plate and optical film to form the component entirety, the platform with the positioning mechanism being removed after the component entirety is clamped by the upper clamping unit and the lower clamping unit.

10. The assembly equipment as claimed in claim 9, characterized in that:
    the main connection elements are fixed by using engagement, screw, soldering or adhesive.

11. The assembly equipment as claimed in claim 9, characterized in that:
    the main connection element comprises at least two connection sub-elements, the at least two connection sub-elements are connected and fixed to form the main connection element.

12. The assembly equipment as claimed in claim 9, characterized in that:
    the main connection elements comprise a first main connection element, a second main connection element, a third main connection element and a fourth main connection element;
    the first main connection element, second main connection element, third main connection element and fourth main connection element all have a long strip shape and are connected and fixed in head-to-tail manner to form a surrounding back plate.

\* \* \* \* \*